United States Patent [19]
Ueno

[11] Patent Number: 5,227,644
[45] Date of Patent: Jul. 13, 1993

[54] HETEROJUNCTION FIELD EFFECT TRANSISTOR WITH IMPROVE CARRIER DENSITY AND MOBILITY

[75] Inventor: Kazuyoshi Ueno, Tokyo, Japan

[73] Assignee: NEC Corporation, Tokyo, Japan

[21] Appl. No.: 709,799

[22] Filed: Jun. 3, 1991

Related U.S. Application Data

[63] Continuation of Ser. No. 549,056, Jul. 6, 1990, abandoned.

[30] Foreign Application Priority Data

Jul. 6, 1989 [JP] Japan .................. 1-172909

[51] Int. Cl.$^5$ .................. H01L 29/06; H01L 31/072
[52] U.S. Cl. .................. 257/20; 257/24; 257/192
[58] Field of Search .......... 357/22 A, 22 MO, 16, 357/22; 257/20, 24, 192

[56] References Cited

U.S. PATENT DOCUMENTS

| | | | |
|---|---|---|---|
| 3,273,030 | 9/1966 | Balk et al. | 357/22 A |
| 4,424,525 | 1/1984 | Mimura | 357/22 A |
| 4,661,829 | 4/1987 | Bean et al. | 357/23.1 |
| 4,695,857 | 9/1987 | Baba et al. | 357/16 |
| 4,697,197 | 9/1987 | Dresner | 357/16 |
| 4,698,652 | 10/1987 | Umemoto et al. | 357/22 A |
| 4,714,948 | 12/1987 | Mimura et al. | 357/22 A |
| 4,734,750 | 3/1988 | Okamura et al. | 357/22 A |
| 4,879,256 | 11/1989 | Bean et al. | 357/16 |
| 4,894,691 | 1/1990 | Matsui | 357/22 A |
| 4,899,201 | 2/1990 | Xu et al. | 357/22 A |
| 4,994,866 | 2/1991 | Awano et al. | 357/16 |
| 5,001,536 | 3/1991 | Fukuzawa et al. | 357/22 A |

FOREIGN PATENT DOCUMENTS

| | | | |
|---|---|---|---|
| A0131379 | 1/1985 | European Pat. Off. | 357/22 MD |
| A0246641 | 11/1987 | European Pat. Off. | 357/22 A |
| A0250886 | 1/1988 | European Pat. Off. | 357/22 A |
| 2913068 | 10/1980 | Fed. Rep. of Germany | 357/22 MD |
| 3542482 | 6/1987 | Fed. Rep. of Germany | 357/22 MD |
| 1-124266 | 5/1989 | Japan | 357/22 A |

*Primary Examiner*—Rolf Hille
*Assistant Examiner*—Steven Loke
*Attorney, Agent, or Firm*—Burns, Doane, Swecker & Mathis

[57] ABSTRACT

A field effect transistor comprising first and second electrodes, semiconductor layers connected to these electrodes to form a carrier channel between them and a control electrode is provided. Said semiconductor layers consisting essentially of: (a) a first semiconductor layer of a first semiconductor material having a low density of state of carrier formed on a substrate, (b) a second semiconductor layer of a second semiconductor material containing an impurity element and having a high density of state of carrier formed on the first semiconductor layer, and (c) a third semiconductor layer of a third semiconductor material having a low density of state of carrier formed on the second semiconductor layer, wherein the impurity element contained in the second semiconductor layer is of n-type when the carrier is an electron or of p-type when the carrier is a hole. By such combination as above of layers of low carrier density of state but high carrier mobility layers and a layer of low carrier mobility but high carrier density of state, higher concentration doping has been made possible. This is effective to realize a high performance FET suitable for larger scale integration.

10 Claims, 2 Drawing Sheets

HETEROJUNCTION FIELD EFFECT TRANSISTOR WITH IMPROVE CARRIER DENSITY AND MOBILITY

This application is a continuation of application Ser. No. 07/549,056, filed Jul. 6, 1990, abandoned.

BACKGROUND OF THE INVENTION

1. Field of the Invention

The present invention relates to a field effect transistor for use in high-speed logic integrated circuits, etc.

2. Description of the Prior Art

As a field effect transistor (FET) which is used as a device for high frequency amplifiers, high-speed computers, etc., a schottky qatc FET (MESFET) using, as its schottky gate, GaAs which has mobility in a low electric field higher than Si (GaAs MESFET), a high electron mobility transistor (HEMT), etc. have vigorously been developed recently.

In order to enhance the performance of a basic device for an integrated circuit for a high-speed computer, particularly the integration scale and the operation velocity, it is very important to realize high current driving-ability. For this, it is necessary to increase the velocity of a carrier and the carrier density, as it can easily be understood from a most simple model wherein the electric current flowing through a channel is in proportion to the product of the carrier density and the carrier velocity. It is also necessary to make the channel layer thinner, for suppressing short channel effects caused by shortening the gate length.

For these reasons, heretofore, for example in the case of said GaAs MESFET, a molecular-beam opitaxy (MBE) method, which is usable for depositing a thin film with the best controllability, has been used for growing the thin film in order to increase the carrier density, and make the channel thinner. The limit of doping with practical controllability by said MBE method, however, is about $2 \times 10^{18}$ cm$^{-3}$.

GaAs has a large electron mobility and so is advantageous for use as a high-speed device material, but owing to its low density state, its doping concentration is limited. On the other hand, Si has a lower electron mobility than GaAs, but has a higher density state sufficient for realizing a high density, not lower than $10^{20}$ cm$^{-3}$. Thus the density state and the mobility of a carrier have a reverse correlation determined by an intrinsic band spectrum construction of the material. This means that in principle it is impossible to increase both of the density state and the carrier mobility.

SUMMARY OF THE INVENTION

An object of the present invention therefore is to realize a high performance FET which can improve integration scale, by effectively combining a merits of a material which has a low carrier density state but a high carrier mobility and a material having a low carrier mobility but a high carrier density state.

Thus the present invention provides a field effect transistor comprising first and second electrodes, semiconductor layers connected to these electrodes to form a carrier channel between them and a control electrode, said semiconductor layers consisting essentially of:

(a) a first semiconductor layer of a first semiconductor material having a low density state of electrons formed on a substrate, (b) a second semiconductor layer of a second semiconductor material containing an n-type impurity element and having a high density state of electrons formed on the first semiconductor layer, and (c) a third semiconductor layer of a third semiconductor material having a low density state of electrons formed on the second semiconductor layer.

The present invention also provides a field effect transistor comprising first and second electrodes, semiconductor layers connected to these electrodes to form a carrier channel between them and a control electrode, said semiconductor layers consisting essentially of:

(a) a first semiconductor layer of a first semiconductor material having a low density state of holes formed on a substrate, (b) a second semiconductor layer of a second semiconductor material containing a p-type impurity element and having a high density state of holes formed on the first semiconductor layer, and (c) a third semiconductor layer of a third semiconductor material having a low density state of holes formed on the second semiconductor layer.

According to the principle of the present invention, the intrinsic problem of a material that the mobility and the density state of a carrier are inversely proportional to each other is solved by using as a carrier supplying layer a semiconductor layer having a low mobility but a high density state and using as a carrier channel layer a semiconductor layer having a mobility as high as possible so that the carrier may flow therein by the merit of penetration of a wave function. For example, in the case of GaAs, the mobility in a low electric field is large, but the electron density is $4.7 \times 10^{17}$ cm$^{-3}$ which is two magnitudes lower than that of Si $2.8 \times 10^{19}$ cm$^{-3}$. In fact, owing to degeneration effect, doping can be made to a concentration as high as $5 \times 10^{18}$ cm$^{-3}$ which is higher than the density, even by said MBE method, but cannot be made to exceed $10^{20}$ cm$^{-3}$. Accordingly, there is a limitation in making a channel having a density as high as possible and a thickness as thin as possible in order to obtain higher performance. According to the present invention, an extremely thin Ge layer having a large electron density of $1 \times 10^{19}$ cm$^{-3}$ is used as an electron supplying layer to enable n-type high concentration doping and to suppress decreases of electron average velocity less than a certain level by utilizing penetration effect of a wave function. Thus it becomes possible to obtain higher performance.

As for material of the electron supplying layer, that is, the second semiconductor material, it is possible and preferable to use Ge, Si or GeSi. As for material of the electron channel layer, that is, the first and the third semiconductor materials, it is possible and preferable to use GaAs or GaSb.

As for material of the hole supplying layer, it is possible and preferable to use Si or GaAs; and as for material of the hole channel layer, it is possible and preferable to use GeSi, Ge, InSb or GaSb.

These materials can be selected from element semiconductor materials or III-V compound semiconductor materials in accordance with the principle of the present invention to obtain the merit of the penetration of wave function as mentioned above. Apparently the first and the third semiconductor materials may be either the same or different materials. Further, even one of the first and the third semiconductor layers may be dispensed with, since the merit of the penetration of wave function can still be obtained.

The thickness of the electron or hole supplying layer should be one to effectively utilize the penetration wave function. In the case of electron supplying layer, it is preferably in the range of 20–100 Å, since if it is less than 20 Å, the effect obtainable by the existence of the electron supplying layer itself would be too small, and if it is much more than 100 Å, the effect obtainable by the penetration of wave function would be to small in view of the Dobye length considered as a reference of the penetration wave function. In the case of hole supplying layer, it is preferably at least 20 Å, since if it is less than 20 Å, the effect obtainable by the existence of the hole supplying layer itself would be too small. There is no critical limitation to the maximum thickness of the hole supplying layer, since holes overflow the hole supplying layer and substantially flow in the hole channel layer of high mobility as if they are confined in the channel layer of shape like a groove or well of their potential curve. The thickness of the hole channel layer therefore is preferably at least 100 Å, and there is no critical limitation to its maximum value.

DESCRIPTION OF THE PREFERRED EMBODIMENTS

The present invention will be explained below further in detail with respect to its some embodiments.

Figure 1:
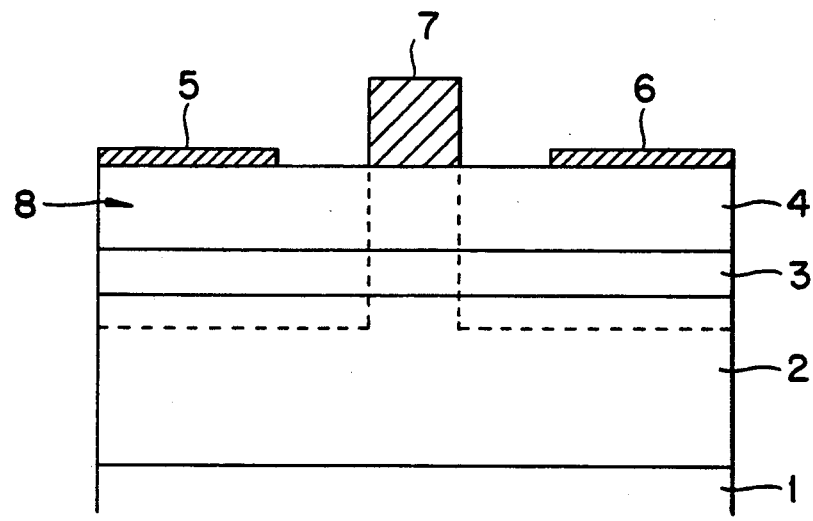
FIG. 1 shows a cross section of an embodiment of the field effect transistor of the present invention.

An FET as shown in FIG. 1 was prepared by the following steps. On a substrate 1 consisting of semi-insulating GaAs, a non-doped GaAs layer 2, a Ge layer 3 doped with $1.2 \times 10^{19}$ cm$^{-3}$ As and a non-doped GaAs layer 4 were grown sequentially by the MBE method, respectively in thicknesses of 600 nm, 10 nm and 20 nm. Then, as a control electrode, a gate electrode 7 consisting of for example WSi$_x$ was formed thereon by deposition by a sputtering method and by processing by a reactive dry etching method. Further, an n-type low resistance area 8 was formed by selectively implanting Si ions by using the gate electrode 7 and a photoresist as a mask under conditions of acceleration energy of 70 keV and dose of $1 \times 10^{13}$ cm$^{-2}$ and then carrying out an activation annealing at 800° C. Finally, a source electrode 5 and a drain electrode 6, both of ohmic contact, were formed by evaporation of AuGe·Ni and an alloying heat treatment.

Figure 2:
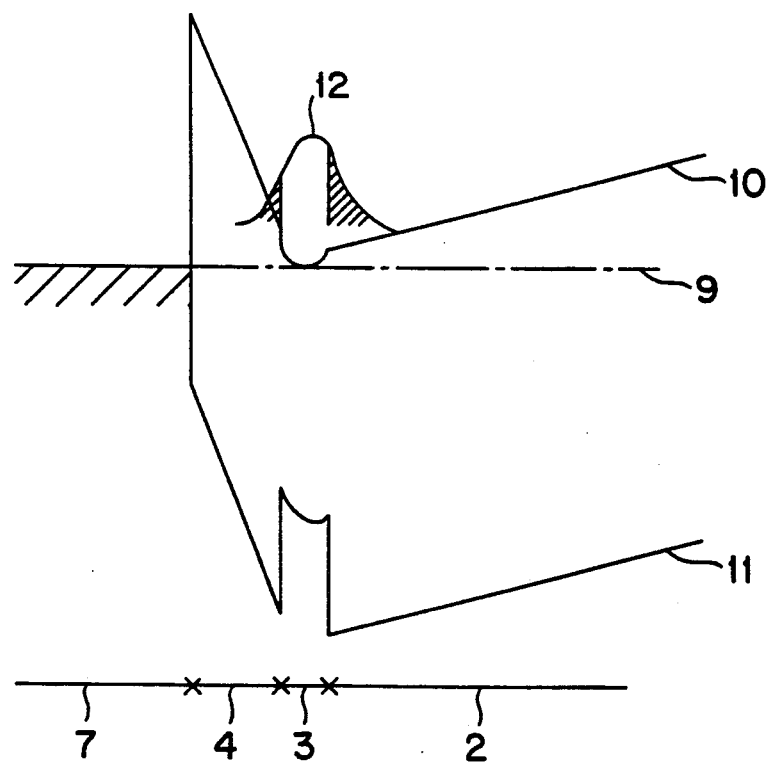
FIG. 2 shows a schematic illustration of energy bands of the FET of FIG. 1 in a thermal equilibrium condition at a position immediately below its gate electrode.

The obtained FET was found to have energy bands in a thermal equilibrium condition, at a position immediately below its gate electrode, as shown in FIG. 2, wherein its Fermi level of electrons 9, minimum point of conduction band 10 and maximum point of valence band 11 are shown. It can be seen in FIG. 2 that the wave function of electrons 12 penetrated into the non-doped GaAs layers 2 and 4 on both sides of the n-type Ge layer 3. By this, an average velocity of electrons in the non-doped GaAs layers 2 and 4 became larger than that in the Ge layer. Further, Ge having a state density of $1 \times 10^{19}$ cm$^{-3}$ was used as an electron supplying layer. It was thus made possible to effect higher doping higher than GaAs which is difficult to effect stable doping higher than $2 \times 10^{18}$ cm$^{-3}$ even if the electron degeneracy is taken into consideration.

Figure 3:
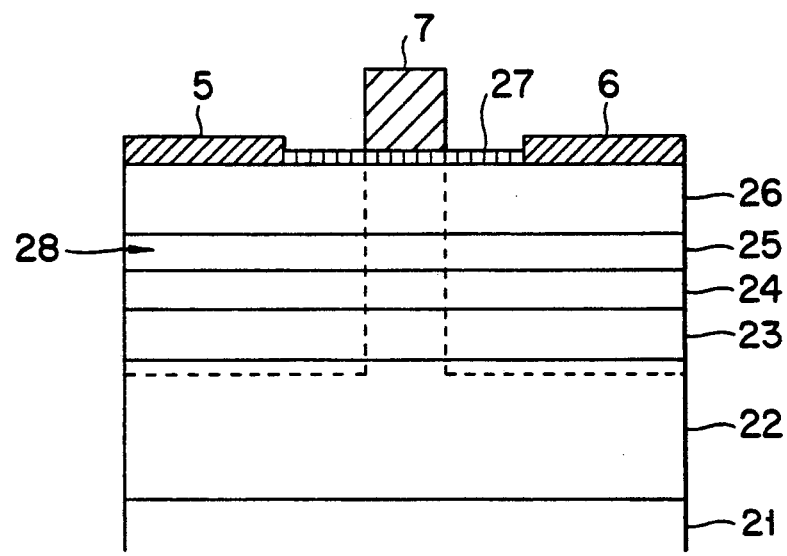
FIG. 3 shows a cross section of another embodiment of the field effect transistor of the present invention.

As another embodiment, an FET as shown in FIG. 3 was prepared by the following steps. On an n-type Si substrate 21, sequentially an n-type Si layer 22 of 600 nm thickness, a non-doped Ge$_{0.5}$Si$_{0.5}$ layer 23 of 30 nm thickness as a carrier channel layer, a p-type Si layer 24 of 5 nm thickness doped with $1 \times 10^{19}$ cm$^{-3}$ Ga as a carrier supplying layer, a non-doped Ge$_{0.5}$Si$_{0.5}$ layer 25 of 10 nm thickness as a carrier channel layer, a low density n-type Si layer 26 of 20 nm thickness and an SiO$_2$ layer 27 of 10 nm thickness formed by surface oxidation were grown by the MBE method. Then a gate electrode 7 consisting of for example WSi$_x$ was formed thereon by deposition by a sputtering method and by processing by a reactive dry etching method. Further, a p-type low resistance area 28 was formed by selectively implanting B ions by using the gate electrodes 7 and a photoresist as a mask under conditions of acceleration energy of 80 keV and dose of $1.4 \times 10^{13}$ cm$^{-2}$ and then carrying out an activation annealing at 900° C. Finally, a source electrode 5 and a drain electrode 6 both of ohmic contact were formed by selective removal of the SiO$_2$ layer, deposition of AlSi and alloying heat treatment.

Figure 4:
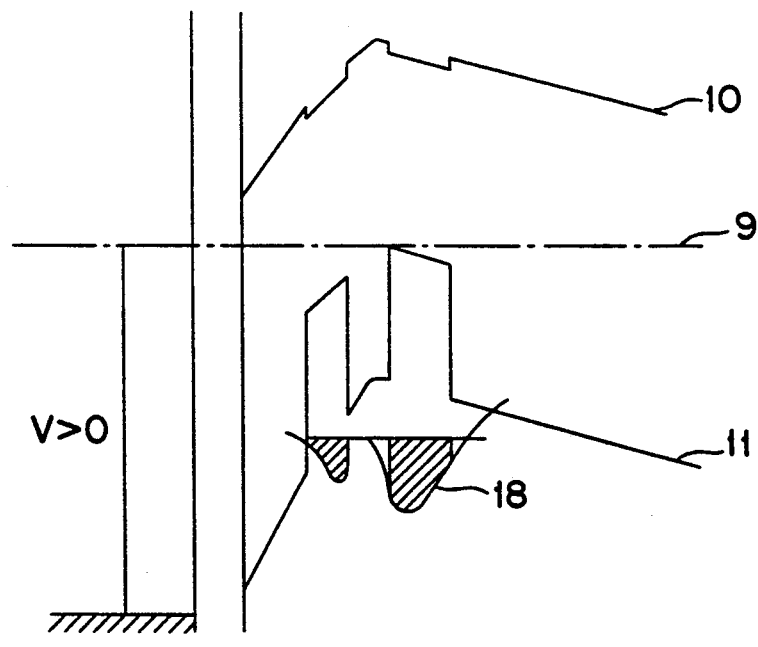
FIG. 4 shows a schematic illustration of energy bands of the FET of FIG. 3 in a depletion layer modulation mode operation condition when a positive voltage is applied to its gate, at a position immediately below its gate electrode.

The obtained FET was found to have energy bands in a depletion layer modulation mode operation condition when a positive voltage is applied to its gate, at a position immediately below its gate electrode, as shown in FIG. 4, wherein its Fermi level of electron 9, minimum point of conduction band 10 and maximum point of valence band 11 are shown. It can be seen in FIG. 4 that the wave function of holes 18 penetrated into the non-doped Ge$_{0.5}$Si$_{0.5}$ layers 23 and 25 on both sides of the p-type Si layer 24. By this, an average velocity of holes in the non-doped Ge$_{0.5}$Si$_{0.5}$ layers 23 and 25 became larger than that in the Si layer. Further, Si having a higher density of state was used as a hole supplying layer. It was thus made possible to achieve higher doping.

As explained above, higher concentration doping has been made possible by the present invention by applying the penetrating effect of a wave function and thereby suppressing decrease of carrier average velocity less than a certain level. Thus it has been made possible to realize a high performance FET suitable for larger scale integration.

I claim:

1. A field effect transistor comprising a substrate, first and second electrodes, semiconductor layers connected to said first and second electrodes to form a carrier channel between said first and second electrodes and a control electrode, said semiconductor layers consisting essentially of:
   (a) a first semiconductor layer, formed on said substrate, of a first semiconductor material having a low density state of electrons,
   (b) a second semiconductor layer, formed on said first semiconductor layer, of a second semiconductor material containing an n-type impurity element and having a high density state of electrons, and
   (c) a third semiconductor layer, formed on said second semiconductor material, of a third semiconductor material having a low density state of electrons, said first and third semiconductor layers having such a small band discontinuity from the second semiconductor layer as to allow penetration of a wave function.

2. The field effect transistor according to the claim 1, wherein the first, the second and the third semiconductor materials are selected from the group consisting of element semiconductor materials and III-V compound semiconductor materials.

3. The field effect transistor according to the claim 2, wherein the first and the third semiconductor materials are selected from the group consisting of GaAs and GaSb and the second semiconductor material is selected from the group consisting of Ge, Si and GeSi.

4. The field effect transistor according to the claim 1, wherein the thickness of the second semiconductor layer is in the range of 20–100 Å.

5. A field effect transistor comprising a substrate, first and second electrodes, semiconductor layers connected to said first and second electrodes to form a carrier channel between said first and second electrodes and a control electrode, said semiconductor layers consisting essentially of:
  (a) a first semiconductor layer, formed on said substrate, of a first semiconductor material having a low density state of holes,
  (b) a second semiconductor layer, formed on said first semiconductor layer, of a second semiconductor material containing a p-type impurity element and having a high density state of holes, and
  (c) a third semiconductor layer, formed on said second semiconductor layer, of a third semiconductor material having a low density state of holes, said first and third semiconductor layers having such a small band discontinuity from the second semiconductor layer as to allow penetration of a wave function.

6. The field effect transistor according to the claim 5, wherein the first, the second and the third semiconductor materials are selected from the group consisting of element semiconductor materials and III-V compound semiconductor materials.

7. The field effect transistor according to the claim 6, wherein the first and the third semiconductor materials are selected from the group consisting of GeSi, Ge, InSb and GaSb and the second semiconductor material is selected from the group consisting of Si and CaAs.

8. The field effect transistor according to the claim 5, wherein the thickness of the second semiconductor layer is at least 20 Å and that of the first and the third semiconductor layers is at least 100 Å.

9. A field effect transistor comprising a substrate, first and second electrodes, semiconductor layers connected to said first and second electrodes to form a carrier channel between said first and second electrodes on the substrate and a control electrode, said semiconductor layers consisting essentially of:
  (a) a first semiconductor layer, formed on said substrate, of a GaAs material having a low density state of electrons,
  (b) a second semiconductor layer having a thickness of not more than 10 nm, formed on said first semiconductor layer, of a Ge material containing an n-type impurity element and having a high density state of electrons, and
  (c) a third semiconductor layer, formed on said second semiconductor layer, of a GaAs material having a low density state of electrons.

10. A field effect transistor comprising a substrate, first and second electrodes, semiconductor layers connected to said first and second electrodes to form a carrier channel between said first and second electrodes on the substrate and a control electrode, said semiconductor layers consisting essentially of:
  (a) a first semiconductor layer, formed on said substrate, of a GeSi material having a low density state of holes,
  (b) a second semiconductor layer, formed on said first semiconductor layer, of a Si material containing a p-type impurity element and having a high density state of holes, and
  (c) a third semiconductor layer, formed on said second semiconductor layer, of a GeSi material having a low density state of holes.

* * * * *